(12) United States Patent
Zhang et al.

(10) Patent No.: US 12,713,568 B2
(45) Date of Patent: Aug. 18, 2026

(54) POWER CONVERSION SYSTEM AND ENERGY STORAGE SYSTEM

(71) Applicant: ZHEJIANG JINKO ENERGY STORAGE CO., LTD., Haining City (CN)

(72) Inventors: Luhua Zhang, Haining City (CN); Jian Yu, Haining City (CN)

(73) Assignee: ZHEJIANG JINKO ENERGY STORAGE CO., LTD., Haining City (CN)

( * ) Notice: Subject to any disclaimer, the term of this patent is extended or adjusted under 35 U.S.C. 154(b) by 134 days.

(21) Appl. No.: 18/928,621

(22) Filed: Oct. 28, 2024

(65) Prior Publication Data

US 2026/0059722 A1 Feb. 26, 2026

(30) Foreign Application Priority Data

Aug. 26, 2024 (CN) ........................ 202411183899.5

(51) Int. Cl.
*H05K 7/20* (2006.01)
*H05K 7/14* (2006.01)
*H02M 7/00* (2006.01)

(52) U.S. Cl.
CPC ....... *H05K 7/20909* (2013.01); *H05K 7/1432* (2013.01); *H02M 7/003* (2013.01)

(58) Field of Classification Search
CPC ........... H05K 7/20909; H05K 7/20863; H05K 7/20872; H05K 7/20881; H05K 7/2089; H05K 7/209; H05K 7/20918; H05K 7/20927; H05K 7/20936; H05K 7/20945; H05K 7/20963; H05K 7/20972; H05K 7/20981; H05K 7/2099; H05K 7/20854; H05K 7/1432; H05K 7/14322; H02M 7/003; H02M 7/006
See application file for complete search history.

(56) References Cited

U.S. PATENT DOCUMENTS

| | | | |
|---|---|---|---|
| 8,593,812 B2 | 11/2013 | Morino et al. | |
| 10,575,433 B2 | 2/2020 | Flavin et al. | |
| 2021/0120704 A1* | 4/2021 | Demetriou | H05K 7/20172 |

(Continued)

FOREIGN PATENT DOCUMENTS

WO WO 2024152652 A1 7/2024

OTHER PUBLICATIONS

Extended European Search Report received in corresponding Application No. EP 24215278.3, dated May 12, 2025, 8 pages.

*Primary Examiner* — Nguyen Tran
(74) *Attorney, Agent, or Firm* — Dority & Manning, PA

(57) ABSTRACT

A power conversion system includes: a tank provided with a first cavity and a second cavity that are separated from each other; a heat exchange member arranged in the second cavity, the heat exchange member having a heat exchange channel, the heat exchange channel having an air inlet and an air outlet in communication with each other, and both the air inlet and the air outlet being in communication with the first cavity; and a first airflow generator arranged in the first cavity and/or the second cavity; the first airflow generator being configured to input gas located in the first cavity into the heat exchange channel via the air inlet, and output gas located in the heat exchange channel into the first cavity via the air outlet.

20 Claims, 7 Drawing Sheets

(56) References Cited

U.S. PATENT DOCUMENTS

| | | | | |
|---|---|---|---|---|
| 2024/0164048 | A1 | 5/2024 | Meng et al. | |
| 2024/0389283 | A1* | 11/2024 | Lian | H05K 7/20154 |
| 2025/0008692 | A1* | 1/2025 | Ren | H05K 7/20336 |

* cited by examiner 123 g2 121(M1)
140 124 120 121(M2) 122 150
F3
F2 F1

POWER CONVERSION SYSTEM AND ENERGY STORAGE SYSTEM

CROSS-REFERENCE TO RELATED APPLICATIONS

This application claims priority of Chinese Patent Application No. 2024111838995, filed on Aug. 26, 2024, entitled "POWER CONVERSION SYSTEM AND ENERGY STORAGE SYSTEM", the entire content of which is incorporated herein by reference in its entirety.

TECHNICAL FIELD

The present disclosure relates to the field of energy storage technologies, and in particular to a power conversion system and an energy storage system having the same.

BACKGROUND

As a small power electronic device, power conversion system is a core device of an energy storage system. With rapid development of energy storage technologies, power conversion systems with same power are becoming smaller in size, which puts forward higher requirements for heat dissipation effects of bidirectional power conversion systems.

SUMMARY

Accordingly, it is necessary to provide a power conversion system and an energy storage system to improve the heat dissipation effect when space is limited.

According to one aspect of the present disclosure, embodiments of the present disclosure provide an power conversion system, including: a tank, the tank being provided with a first cavity and a second cavity that are separated from each other; a heat exchange member arranged in the second cavity; the heat exchange member having a heat exchange channel, the heat exchange channel having an air inlet and an air outlet in communication with each other, and both the air inlet and the air outlet being in communication with the first cavity; and a first airflow generator arranged in the first cavity and/or the second cavity; the first airflow generator being configured to input gas located in the first cavity into the heat exchange channel via the air inlet and output gas located in the heat exchange channel into the first cavity via the air outlet; the heat exchange member includes a plurality of heat exchange bodies, the heat exchange bodies are provided with heat exchange sub-channels, all the heat exchange sub-channels form the heat exchange channel, inlets of all the heat exchange sub-channels define the air inlet, and outlets of all the heat exchange sub-channels define the air outlet; and all the heat exchange bodies are sequentially arranged along a direction in which the first cavity points to the second cavity.

In an embodiment, along the direction in which the first cavity points to the second cavity, a first interval is formed between two adjacent heat exchange bodies.

In an embodiment, the heat exchange member further includes plurality of partitions; and along an extension direction of the heat exchange channel, the plurality of partitions are sequentially spaced apart in the first interval.

In an embodiment, along the direction in which the first cavity points to the second cavity, the partition is connected to two corresponding heat exchange bodies; and/or the partition extends along a first preset direction, and the first preset direction, the direction in which the first cavity points to the second cavity, and the direction in which the air inlet points to the air outlet are perpendicular to each other.

In an embodiment, the power conversion system further includes a first communication member and a second communication member that are arranged in the second cavity and connected to the heat exchange bodies; the first communication member has a first communication cavity, and the second communication member having a second communication cavity; the first communication cavity is in communication with the first cavity and the air inlet, and the second communication cavity is in communication with the first cavity and the air outlet.

In an embodiment, along a direction in which the air inlet points to the air outlet, the first communication cavity has a first inner wall arranged towards the second communication cavity, and the second communication cavity has a second inner wall arranged towards the first communication cavity; and the inlets of all the heat exchange sub-channels are provided in the first inner wall, and the outlets of all the heat exchange sub-channels are provided in the second inner wall.

In an embodiment, the first communication cavity has a first communication port in communication with the first cavity, and a dimension of the first communication port along a second preset direction is equal to a dimension of the inlet of each of the heat exchange sub-channels along the second preset direction; and the second preset direction, the direction in which the first cavity points to the second cavity, and a direction in which the air inlet points to the air outlet are perpendicular to each other; and/or the second communication cavity has a second communication port in communication with the first cavity, and a dimension of the second communication port along a third preset direction is equal to a dimension of the inlet of each of the heat exchange sub-channels along the third preset direction; and the third preset direction, the direction in which the first cavity points to the second cavity, and the direction in which the air inlet points to the air outlet are perpendicular to each other; and/or a volume of the first communication cavity is equal to that of the second communication cavity; and/or the first inner wall and the second inner wall are both arranged perpendicularly to the direction in which the air inlet points to the air outlet.

In some embodiments, along the direction in which the first cavity points to the second cavity, a dimension of the first communication cavity is greater than a sum of dimensions of all the heat exchange sub-channels; and/or along the direction in which the first cavity points to the second cavity, a dimension of the second communication cavity is greater than a sum of dimensions of all the heat exchange sub-channels.

In an embodiment, the tank includes a partition wall, and the first cavity and the second cavity are separated via the partition wall; and the heat exchange body in all the heat exchange bodies that is closest to the first cavity is a first target body, and a second interval is formed between the first target body and the partition wall.

In an embodiment, the heat exchange member further includes a plurality of first heat exchange fins; and along an extension direction of the heat exchange channel, all the first heat exchange fins are sequentially spaced apart in the second interval.

In an embodiment, the heat exchange member further includes a plurality of second heat exchange fins; and the heat exchange body in all the heat exchange bodies that is farthest from the first cavity is a second target body; and along an extension direction of the heat exchange channel, all the second heat exchange fins are sequentially spaced apart on a side of the second target body away from the first cavity.

In an embodiment, the heat exchange sub-channels extend linearly along a direction in which the air inlet points to the air outlet, the direction in which the air inlet points to the air outlet is perpendicular to the direction in which the first cavity points to the second cavity; and/or along the direction in which the air inlet points to the air outlet, cross-sectional areas of all the heat exchange sub-channels are equal; and/or along the direction in which the air inlet points to the air outlet, the cross-sectional areas of the heat exchange sub-channels are unchanged; and/or two heat exchange sub-channels are provided.

In an embodiment, the first airflow generator includes a first airflow generating member and a second airflow generating member; the first airflow generating member is arranged in the first cavity or the second cavity, and the second airflow generating member is arranged in the first cavity or the second cavity; and the first airflow generating member and the second airflow generating member are sequentially located on a target path, the target path being a fluid path where an airflow flows through the air outlet and sequentially enters between the first cavity and the air inlet.

In an embodiment, both the first airflow generating member and the second airflow generating member are arranged in the first cavity.

In an embodiment, the first cavity has two first side walls oppositely arranged along a first direction, and two second side walls oppositely arranged along a second direction; each of the first side walls is connected to the two second side walls, and each of the first side walls and the two second side walls define two corner portions; the first airflow generating member is arranged in a first target corner portion, and the second airflow generating member is arranged in a second target corner portion; the first target corner portion and the second target corner portion are two corner portions in all the corner portions and not adjacent along a circumferential direction of the first cavity; the circumferential direction of the first cavity is an arrangement direction of the two first side walls and the two second side walls, and the first direction, the second direction, and the direction in which the first cavity points to the second cavity are perpendicular to each other.

In an embodiment, the air outlet is arranged adjacent to the second target corner portion, and the air inlet is arranged adjacent to a third target corner portion; the third target corner portion is one of the remaining corner portions in the four corner portions except the first target corner portion and the second target corner portion.

In an embodiment, an outlet side of the first airflow generating member is arranged towards the third target corner portion, and an outlet side of the second airflow generating member is arranged towards a fourth target corner portion; the fourth target corner portion is one of the remaining corner portions in the four corner portions except the first target corner portion, the second target corner portion, and the third target corner portion.

In an embodiment, an outlet direction of the first airflow generating member, an outlet direction of the second airflow generating member, and a target direction are parallel to each other, and the outlet direction of the first airflow generating member and the outlet direction of the second airflow generating member are opposite to each other; and the target direction is parallel to the first direction or the second direction.

In an embodiment, the power conversion system further includes a flow guiding member arranged in the first cavity; the flow guiding member has a flow guiding inlet and a flow guiding outlet in communication with each other, the flow guiding inlet is in communication with the air outlet, and the flow guiding outlet being in communication with an inlet of the second airflow generating member.

In an embodiment, an end of the flow guiding member provided with the flow guiding outlet is connected to an air inlet side of the second airflow generating member.

In an embodiment, the power conversion system further includes a partition wall arranged in the tank, and the first cavity and the second cavity are separated via the partition wall; the partition wall including a first region and a second region arranged around the first region; and the power conversion system further includes a plurality of electronic components arranged in the first cavity, all the electronic components being arranged in the first region.

In an embodiment, the power conversion system further includes a printed circuit board (PCB) arranged on the partition wall and located in the first cavity, and all the electronic components are arranged on the PCB.

In an embodiment, the first airflow generating member is a fan; and/or the second airflow generating member is a fan.

In an embodiment, the tank is provided with a first vent communicating the second cavity with the outside of the tank; and the power conversion system further includes a second airflow generator arranged in the second cavity; the second airflow generator being configured to input gas located outside the tank into the second cavity via the first vent and output gas located in the second cavity to the outside of the tank.

In an embodiment, the first vent includes a first through hole located on the air inlet side of the second airflow generator and a second through hole located on an air outlet side of the second airflow generator; and along a direction in which the first through hole points to the second through hole, the heat exchange member is located between the first through hole and the second airflow generator.

In an embodiment, the second airflow generator includes a plurality of third airflow generating members sequentially arranged along a fourth preset direction; and air inlet sides of the third airflow generating members are located on a same side, and air outlet sides of the third airflow generating members are located on a same side; and a direction in which the air inlet sides of the third airflow generating members point to the air outlet sides of the third airflow generating members is perpendicular to the fourth preset direction.

In an embodiment, the second airflow generator is configured to include at least one fan.

In an embodiment, the tank is provided with a second vent communicating the second cavity with the outside of the tank; and an orthographic projection of the second vent on a reference plane at least partially overlaps with an orthographic projection of the heat exchange member on the reference plane; the reference plane being a plane perpendicular to the direction in which the first cavity points to the second cavity; and/or the second cavity is located on a bottom side of the first cavity, and the direction in which the first cavity points to the second cavity is a direction of gravity.

According to another aspect of the present disclosure, embodiments of the present disclosure provide an energy storage system, including the power conversion system in any one of the above embodiments.

In the power conversion system and the energy storage system above, the power conversion system includes at least a tank, a heat exchange member, and a first airflow generator. The tank is provided with a first cavity and a second cavity separated from each other, and the heat exchange member is arranged in the second cavity, so that both an air inlet and an air outlet of the heat exchange member are in communication with the first cavity. In this way, main heat-generating components can be placed in the first cavity. Therefore, under the action of the first airflow generator, gas in the first cavity can exchange heat with gas in the second cavity via a heat exchange channel of the heat exchange member, thereby helping improve heat dissipation efficiency of the main heat-generating components in the first cavity. At the same time, since the heat exchange member is located in the second cavity, extra space in the first cavity may not be occupied, which is conducive to arrangement of related components in the first cavity. Further, the heat exchange member is configured to include a plurality of heat exchange bodies, so that the heat exchange channel is formed by a plurality of heat exchange sub-channels and the gas in the first cavity can enter different heat exchange sub-channels respectively when entering the heat exchange member. All the heat exchange sub-channels may rectify an incoming relatively disordered airflow, so that the airflow has a more orderly state, thereby reducing flow resistance, facilitating the airflow to circulate between the first cavity and the heat exchange channel under the action of the first airflow generator, further facilitating heat dissipation of electronic components, and further improving a heat dissipation effect. Compared with the manner in which the related components are cooled by liquid cooling, the manner provided in the embodiments of the present disclosure can reduce condensation on surfaces of the related components and improve safety performance. Compared with the manner in which the related components are cooled by liquid cooling, in the manner provided in the embodiments of the present disclosure, via the heat exchange member arranged in the second cavity separated from the first cavity in combination with the use of a structure in which the heat exchange member has a plurality of heat exchange sub-channels, the gas in the second cavity can be used to perform heat exchange with the gas in the first cavity without affecting mounting of the related components, thereby helping improve the heat dissipation effect. Therefore, the apparatus provided in the embodiments of the present disclosure can improve the heat dissipation effect when space is limited and can also improve safety performance.

Additional aspects and advantages of the embodiments of the present disclosure will be set forth in part in the description below, and in part will be apparent from the description, or learned through practice of the embodiments of the present disclosure.

BRIEF DESCRIPTION OF THE DRAWINGS

Various other advantages and benefits will become apparent to those of ordinary skill in the art upon reading the following detailed description of the embodiments. The drawings are only for the purpose of illustrating the embodiments and are not to be considered as limitations on the present disclosure. Moreover, same members are represented by same reference numerals throughout the drawings. In the drawings.

REFERENCE SIGNS

Figure 1:
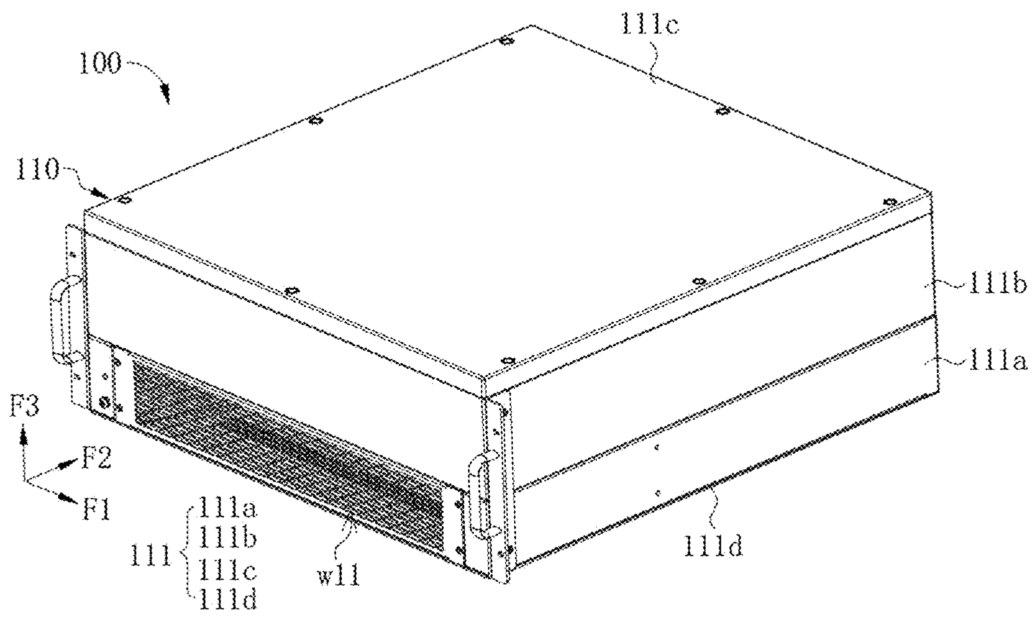
FIG. 1 is a perspective view of an power conversion system according to some embodiments of the present disclosure.

- power conversion system 100;
- tank 110, tank body 111, first frame body 111*a*, second frame body 111*b*, cover plate 111*c*, bottom plate 111*d*, accommodation cavity Q, first cavity Q1, first side wall C1, second side wall C2, corner portion CP, first corner portion CP1, second corner portion CP2, third corner portion CP3, fourth corner portion CP4, second cavity Q2, partition wall 112, first opening u1, second opening u2, first region z1, second region z2, first vent w1, first through hole w11, second through hole w12, second vent w2;
- heat exchange member 120, heat exchange channel P, air inlet k1, air outlet k2, heat exchange body 121, sub-heat exchange channel p1, sub-air inlet k11, sub-air outlet k21, first interval g1, first target body M1, second target body M2, partition 122, second interval g2, first heat exchange fin 123, second heat exchange fin 124;
- first airflow generator 130, first airflow generating member 131, and second airflow generating member 132;
- first communication member 140, first communication cavity L1, first inner wall b1, first communication port t1;
- second communication member 150, second communication cavity L2, second inner wall b2, second communication port t1;
- flow guiding member 160, flow guiding cavity D, flow guiding inlet d1, flow guiding outlet d2;
- PCB 170;
- second airflow generator 180, third airflow generating member 181;
- first dimension h1, second dimension h2;
- first direction F1, second direction F2, third direction F3.

DETAILED DESCRIPTION OF EMBODIMENTS

In order to make the above objectives, features, and advantages of the present disclosure more obvious and understandable, specific implementations of the present disclosure are described in detail below with reference to the accompanying drawings. In the following description, many specific details are set forth in order to fully understand the present disclosure. However, the present disclosure can be implemented in many other ways different from those described herein, and those skilled in the art can make similar improvements without departing from the connotation of the present disclosure. Therefore, the present disclosure is not limited by specific embodiments disclosed below.

In the description of the present disclosure, it is to be understood that the orientation or position relationships indicated by the terms "central", "longitudinal", "transverse", "length", "width", "thickness", "upper", "lower", "front", "back", "left", "right", "vertical", "horizontal", "top", "bottom", "inner", "outer", "clockwise", "counter-clockwise", "axial", "radial", "circumferential", and the like are based on the orientation or position relationships shown in the accompanying drawings and are intended to facilitate the description of the present disclosure and simplify the description only, rather than indicating or implying that the apparatus or element referred to must have a particular orientation or be constructed and operated in a particular orientation, and therefore are not to be interpreted as limiting the present disclosure.

In addition, the terms "first" and "second" are used for descriptive purposes only, which cannot be construed as indicating or implying a relative importance, or implicitly specifying the number of the indicated technical features. Therefore, the features defined with "first" and "second" may explicitly or implicitly include at least one feature. In the description of the present disclosure, "a plurality of" means at least two, such as two or three, unless otherwise defined explicitly and specifically.

In the present disclosure, unless otherwise specified and defined explicitly, the terms "mount", "connect", "join", and "fix" should be understood in a broad sense, which may be, for example, a fixed connection, a detachable connection, or an integral connection; a mechanical connection or an electrical connection; or a direct connection, an indirect connection via an intermediate medium, an internal connection between two elements, or interaction between two elements. Those of ordinary skill in the art can understand specific meanings of these terms in the present disclosure according to specific situations.

In the present disclosure, unless otherwise explicitly specified and defined, the expression a first feature being "on" or "under" a second feature may be the case that the first feature is in direct contact with the second feature, or the first feature is in indirect contact with the second feature via an intermediate medium. Furthermore, the expression the first feature being "over", "above" and "on top of" the second feature may be the case that the first feature is directly above or obliquely above the second feature, or only means that the level of the first feature is higher than that of the second feature. The expression the first feature being "below", "underneath" or "under" the second feature may be the case that the first feature is directly underneath or obliquely underneath the second feature, or only means that the level of the first feature is lower than that of the second feature.

It is to be noted that when one element is referred to as being "fixed to" or "arranged on" another element, it may be directly disposed on the other element or an intermediate element may exist. When one element is considered to be "connected to" another element, it may be directly connected to another element or an intermediate element may co-exist. If any, the terms "vertical", "horizontal", "left", "right" and similar expressions used in the present disclosure are for illustrative purposes only and do not represent an only implementation.

Figure 2:
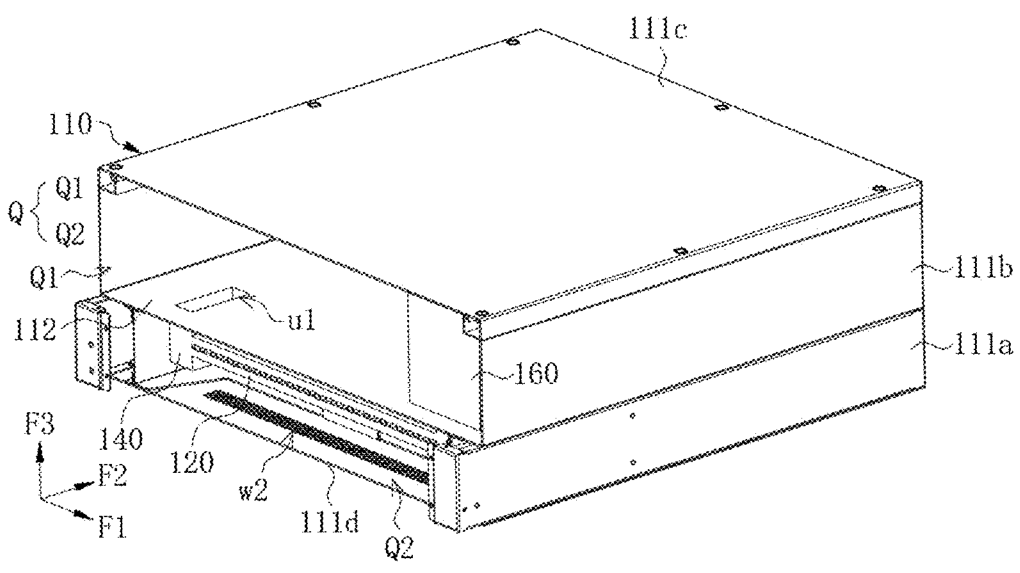
FIG. 2 is a perspective view of the power conversion system shown in FIG. 1 with a partial structure removed.
Figure 3:
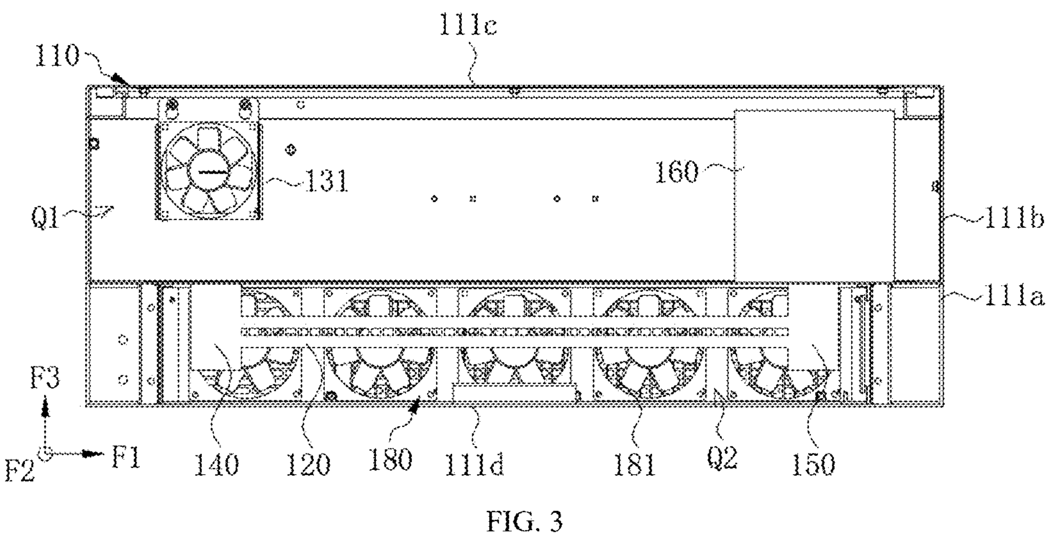
FIG. 3 is a front view of the power conversion system shown in FIG. 1 with a partial structure removed.
Figure 4:
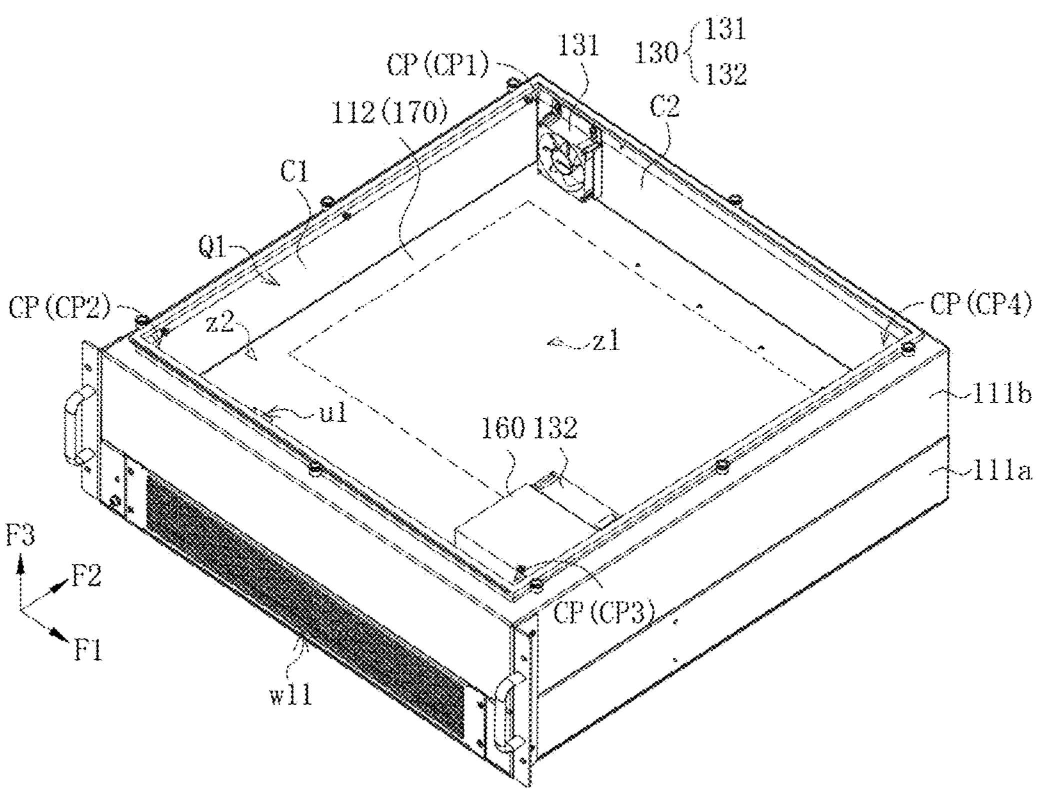
FIG. 4 is another perspective view of the power conversion system shown in FIG. 1 with a partial structure removed.

FIG. 1 is a perspective view of an power conversion system 100 according to some embodiments of the present disclosure; FIG. 2 is a perspective view of the power conversion system 100 shown in FIG. 1 with a partial structure removed; FIG. 3 is a front view of the power conversion system 100 shown in FIG. 1 with a partial structure removed; and FIG. 4 is another perspective view of the power conversion system 100 shown in FIG. 1 with a partial structure removed. For ease of description, only content related to the embodiments of the present disclosure is illustrated.

Referring to FIG. 1 to FIG. 4, embodiments of the present disclosure provides an power conversion system 100, including a tank 110, a heat exchange member 120, and a first airflow generator 130.

The tank 110 has an accommodation cavity Q. The accommodation cavity Q is configured to accommodate related components of the power conversion system 100, which can ameliorate an influence of foreign matter on use of the related components in the power conversion system 100. The tank 110 may have a simple three-dimensional structure such as a single cuboid or a complex three-dimensional structure formed by simple three-dimensional structures such as cuboids, which is not limited herein. In the embodiments of the present disclosure, taking FIG. 1 as an example, the tank 110 has a shape of a cuboid. A first direction F1 and a second direction F2 are a length direction and a width direction of the tank 110 respectively, and a third direction F3 is a height direction of the tank 110. A dimension of the tank 110 along the length direction and a dimension of the tank 110 along the width direction may or may not be equal. The first direction F1, the second direction F2, and the third direction F3 are perpendicular to each other.

For example, referring to FIG. 1 and FIG. 2, the tank 110 includes a tank body 111, and the tank body 111 forms a main part of the tank 110. The tank body 111 includes a frame body. The frame body may include a first frame body 111*a* and a second frame body 111*b* stacked along the third direction F3. The first frame body 111*a* and the second frame body 111*b* may be of an integrated structure or a separated structure. The integrated structure refers to a structure formed by connecting two components into an entirety, and the two components are no longer two separate components. For example, the first frame body 111*a* and the second frame body 111*b* may be connected by welding, hot melt welding, or integrated molding. Integrated molding means that a whole component is formed by a same material through an integrated molding process. The separated structure refers to a structure in which two components are fixedly connected through a related connector. A selection may be made according to a specific usage condition, which is not specifically limited herein.

Further, the tank 110 further includes a cover plate 111*c* covering the top of the frame body and a bottom plate 111*d* arranged at the bottom of the frame body. That is, the cover plate 111*c* covers a side of the first frame body 111*a* away from the second frame body 111*b*, and the bottom plate 111*d* is arranged on a side of the second frame body 111*b* away from the first frame body 111*a*. Certainly, the cover plate 111*c* and the frame body may alternatively be of an integrated structure or may be of a separated structure, and the bottom plate 111*d* and the frame body may alternatively be of an integrated structure or a separated structure, which is not specifically limited herein. The first frame body 111*a*, the second frame body 111*b*, the cover plate 111*c*, and the bottom plate 111*d* cooperatively define a space (i.e., the accommodation cavity Q) for accommodating the related components in the power conversion system 100.

Referring to FIG. 2 to FIG. 4, the tank 110 is provided with a first cavity Q1 and a second cavity Q2 separated from each other. That is, the accommodation cavity Q includes the first cavity Q1 and the second cavity Q2 separated from each other. For example, the tank 110 further includes a partition wall 112, and the partition wall 112 is arranged in the accommodation cavity Q and divides the accommodation cavity Q into the first cavity Q1 and the second cavity Q2. Specifically, the first cavity Q1 may be defined by the first frame body 111*a*, the partition wall 112, and the cover plate 111*c*, and the second cavity Q2 may be defined by the second frame body 111*b*, the partition wall 112, and the bottom plate 111*d*. The partition wall 112 and the frame body may be of an integrated structure or a separated structure, which is not specifically limited herein. Further, the partition wall 112 may be a board, which is integrally connected to the first frame body 111*a* or the second frame body 111*b*. Certainly, the partition wall 112 may be two boards stacked along the third direction F3. One board is integrally connected to the first frame body 111*a*, and the other board is integrally connected to the second frame body 111*b*. The structure of the partition wall 112 may be configured according to a specific usage condition, which is not specifically limited herein.

The first cavity Q1 may be configured to receive main electronic components. The second cavity Q2 may be configured to receive components (such as an inductor, a power module, and a heat sink) used in conjunction with the main electronic components. The first cavity Q1 may be configured as a closed structure, which can protect the electronic components so that the electronic components are in a relatively stable and dry environment. The second cavity Q2 may be configured as a structure in communication with the outside of the tank 110. In this way, gas in the second cavity Q2 may be exchanged with gas outside the tank 110. In this way, the components used in conjunction may not occupy extra mounting space of the electronic components, making the overall structure more compact.

Figure 5:
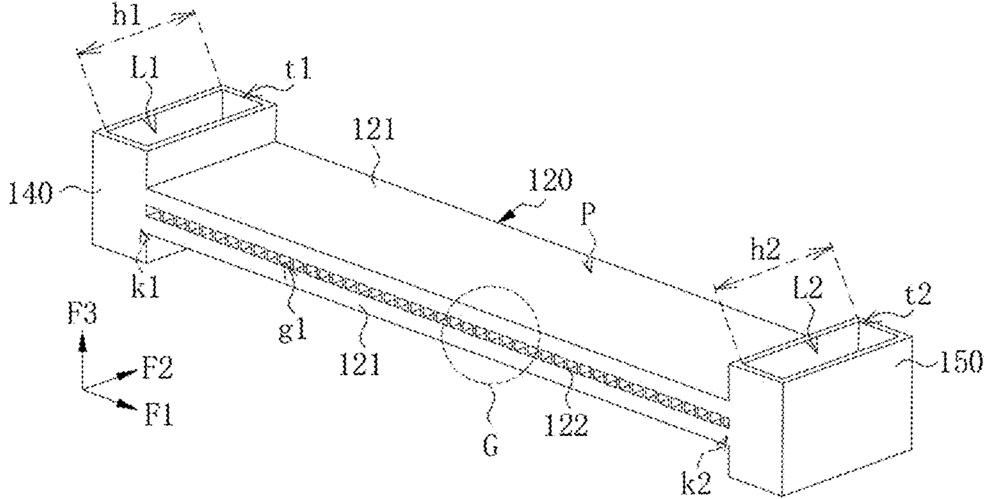
FIG. 5 is a perspective view showing cooperation between a heat exchange member, a first communication member, and a second communication member in the power conversion system shown in FIG. 1.

The heat exchange member 120 is a component for heat exchange. Referring to FIG. 2 and FIG. 3 together with FIG. 5, FIG. 5 is a perspective view showing cooperation between a heat exchange member 120, a first communication member 140, and a second communication member 150 in the power conversion system 100 shown in FIG. 1. The first communication member 140 and the second communication member 150 may be further described later. The heat exchange member 120 is arranged in the second cavity Q2. The heat exchange member 120 has a heat exchange channel P. The heat exchange channel P has an air inlet k1 and an air outlet k2 that are in communication with each other. Both the air inlet k1 and the air outlet k2 are in communication with the first cavity Q1. The heat exchange channel P, the air inlet k1, and the air outlet k2 are located inside the heat exchange member 120 and are not shown in FIG. 5, dashed arrows indicate approximate positions of the heat exchange channel P, the air inlet k1, and the air outlet k2 in FIG. 5.

Figure 6:
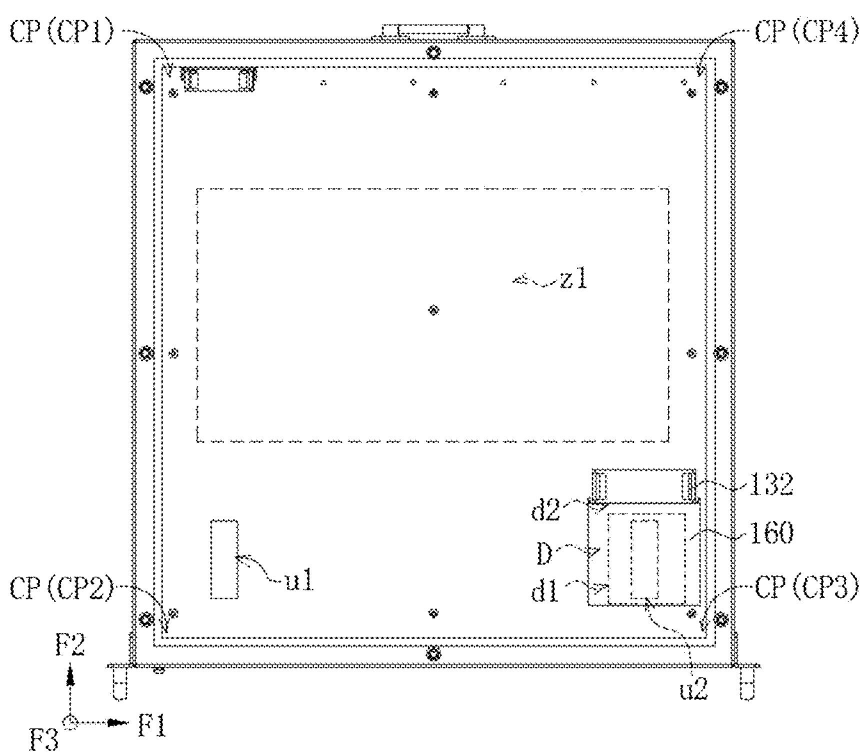
FIG. 6 is a top view of the power conversion system shown in FIG. 1 with a partial structure removed.

For example, taking FIG. 4 and FIG. 6 as an example, FIG. 6 is a top view of the power conversion system 100 shown in FIG. 1 with a partial structure removed. The partition board is provided with a first opening u1 and a second opening u2. The first opening u1 is in communication with the air inlet k1 of the heat exchange channel P, and the second opening u2 is in communication with the air outlet k2 of the heat exchange channel P. FIG. 6 illustrates a flow guiding member 160 which will be described in some embodiments later. Since the second opening u2 is blocked by the flow guiding member 160, an approximate structure and a position of the second opening u2 are shown with dashed boxes and marked with dashed arrows in FIG. 6. Further, the first opening u1 may be in communication with the air inlet k1 of the heat exchange channel P via the first communication member 140, and the second opening u2 may be in communication with the air outlet k2 of the heat exchange channel P via the second communication member 150. Certainly, the first opening u1 may alternatively be directly in communication with the air inlet k1, and the second opening u2 may alternatively be directly in communication with the air outlet k2, which is not specifically limited herein. In this way, the gas in the first cavity Q1 may flow into the heat exchange channel P via the air inlet k1 and flow back into the first cavity Q1 via the air outlet k2.

It is to be noted that the closed structure defined by the first cavity Q1 is relative. Combined with the first opening u1 and the second opening u2 in the partition board, the heat exchange channel P of the heat exchange member 120 and the first cavity Q1 in communication with each other form a relatively closed structure.

The first airflow generator 130 is a component configured to generate an airflow. The first airflow generator 130 is arranged in the first cavity Q1 and/or the second cavity Q2. That is, the first airflow generator may be arranged in the first cavity Q1 or in the second cavity Q2, or one part may be arranged in the first cavity Q1 and the other part may be arranged in the second cavity Q2. When at least part of the first airflow generator 130 is arranged in the second cavity Q2, at least part of the first airflow generator 130 is located in the heat exchange channel P. Taking FIG. 3, FIG. 4, and FIG. 6 as an example, the first airflow generator 130 is arranged in the first cavity Q1.

The first airflow generator 130 is configured to input gas located in the first cavity Q1 into the heat exchange channel P via the air inlet k1 and output gas located in the heat exchange channel P into the first cavity Q1 via the air outlet k2. That is, when the first airflow generator 130 generates an airflow, the gas in the first cavity Q1 is driven by the airflow to be inputted into the heat exchange channel P, and continues to be driven by the airflow to be outputted to the first cavity Q1.

Specifically, the first airflow generator 130 may be a fan assembly, and rotation of fan blades can drive the gas in the first cavity Q1 to enter the heat exchange channel P and to exchange heat with the gas in the second cavity Q2, reducing an internal temperature of the first cavity Q1. Certainly, the first airflow generator 130 may alternatively be another component that can generate an airflow such as a blower, which is not specifically limited herein.

In the embodiments of the present disclosure, the tank 110 is provided with the first cavity Q1 and the second cavity Q2 separated from each other, and the heat exchange member 120 is arranged in the second cavity Q2, so that both the air inlet k1 and the air outlet k2 of the heat exchange member 120 are in communication with the first cavity Q1. In this way, main heat-generating components (e.g., the electronic components) can be placed in the first cavity Q1. Therefore, under the action of the first airflow generator 130, gas in the first cavity Q1 can exchange heat with gas in the second cavity Q2 via the heat exchange channel P of the heat exchange member 120, thereby helping to improve heat dissipation efficiency of the main heat-generating components in the first cavity Q1. At the same time, since the heat exchange member 120 is located in the second cavity Q2, extra space in the first cavity Q1 may not be occupied, which is conducive to arrangement of related components in the first cavity Q1.

It should be understood that if the related components are cooled by liquid cooling, heat generated by the related components is generally taken away in a manner that coolant flows through a heat exchange component such as a cold plate. However, in a relatively high-temperature high-humidity environment, a surface of a low-temperature object in direct contact with the coolant at a lower temperature is easy to condense. In this case, an electrically charged electronic component may be short-circuited, thereby leading to safety risks such as thermal runaway and fire. If the related components are cooled directly by air cooling, a heat dissipation effect achieved by air cooling is required to be improved compared with liquid cooling.

Therefore, compared with the manner in which the related components are cooled by liquid cooling, the manner provided in the embodiments of the present disclosure can reduce condensation on surfaces of the related components and improve safety performance via the heat exchange member 120 and the first airflow generator 130 that cooperate with each other. Compared with the manner in which the related components are cooled by air cooling, in the embodiments of the present disclosure, since the heat exchange member 120 is arranged in the second cavity Q2 separated from the first cavity Q1, the gas in the second cavity Q2 can be used to perform heat exchange with the gas in the first cavity Q1 without affecting mounting of the related components, thereby helping to improve the heat dissipation effect. Therefore, the apparatus provided in the embodiments of the present disclosure can improve the heat dissipation effect when space is limited and can also improve safety performance.

Figure 7:
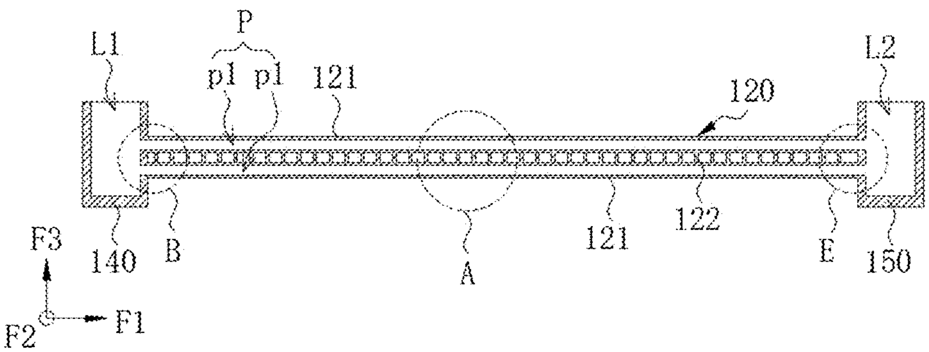
FIG. 7 is a sectional view structure of the structure shown in FIG. 5.
Figure 8:
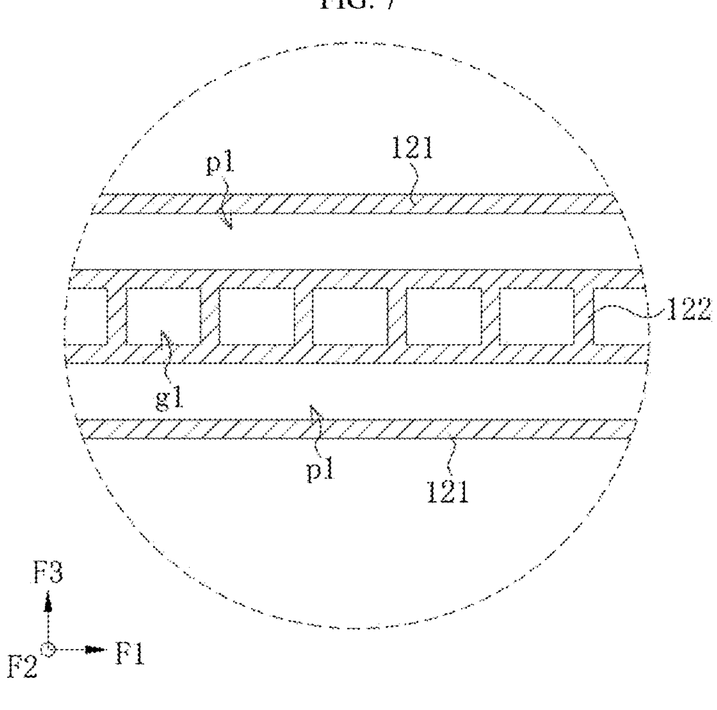
FIG. 8 is a partial enlarged structure at A in FIG. 7.

FIG. 7 is a sectional view structure of the structure shown in FIG. 5; and FIG. 8 is a partial enlarged structure at A in FIG. 7. For ease of description, only content related to the embodiments of the present disclosure is illustrated.

In some embodiments, still referring to FIG. 2, FIG. 3, and FIG. 5 together with FIG. 7 and FIG. 8, the heat exchange member 120 includes a plurality of heat exchange bodies 121. The heat exchange bodies 121 are provided with a plurality of heat exchange sub-channels p1. All the heat exchange sub-channels p1 form the heat exchange channel P. Inlets of all the heat exchange sub-channels p1 define the air inlet k1, and outlets of all the heat exchange sub-channels p1 define the air outlet k2. All the heat exchange bodies 121 are sequentially arranged along a direction in which the first cavity Q1 points to the second cavity Q2.

Figure 9:
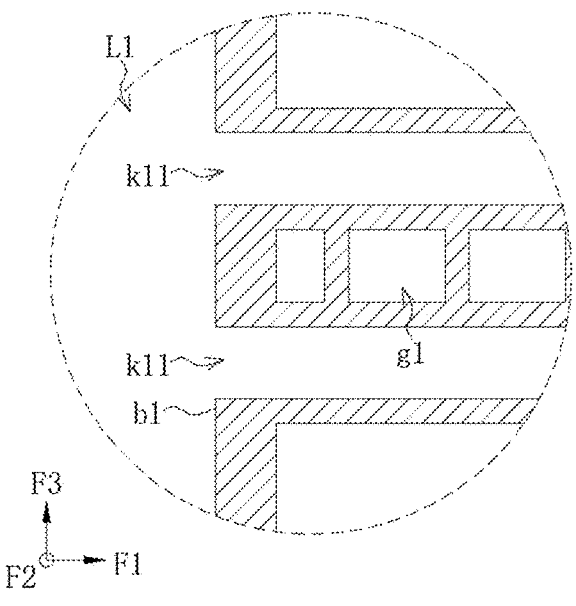
FIG. 9 is a partial enlarged structure at B in FIG. 7.
Figure 10:
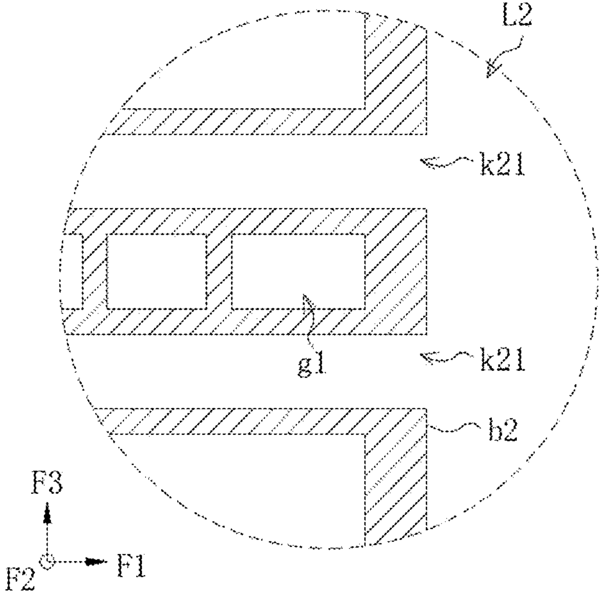
FIG. 10 is a partial enlarged structure at E in FIG. 7.

For example, referring to FIG. 9 and FIG. 10, FIG. 9 is a partial enlarged structure at B in FIG. 7, and FIG. 10 is a partial enlarged structure at E in FIG. 7. The inlet of the sub-heat exchange channel p1 is a sub-air inlet k11, and the outlet of the sub-heat exchange channel p1 is a sub-air outlet k21. The sub-air inlets k11 of all the heat exchange sub-channels p1 define the air inlet k1. That is, the air inlet k1 of the heat exchange channel P includes the sub-air inlets k11 of all the heat exchange sub-channels p1. The sub-air outlets k21 of all the heat exchange sub-channels p1 define the air outlet k2. That is, the air outlet k2 of the heat exchange channel P includes the sub-air outlets k21 of all the heat exchange sub-channels p1.

All the heat exchange bodies 121 are sequentially arranged along the direction in which the first cavity Q1 points to the second cavity Q2. In the embodiments of the present disclosure, referring to FIG. 2 and FIG. 3, the direction in which the first cavity Q1 points to the second cavity Q2 is parallel to the third direction F3. That is, referring to FIG. 7 and FIG. 8, all the heat exchange bodies 121 are sequentially arranged along the third direction F3. Two, three, four, six, or other numbers of heat exchange bodies 121 may be provided. Taking FIG. 7 to FIG. 10 as an example, two heat exchange bodies 121 are provided and two heat exchange sub-channels p1 are provided. Along the third direction F3, there may be no interval between two adjacent heat exchange bodies 121, or an interval may be defined. When there is no interval between two adjacent heat exchange bodies 121, sides of the two heat exchange bodies 121 facing each other fit each other, or the sides of the two heat exchange bodies 121 facing each other share a wall, which may be set according to a specific usage condition and is not specifically limited herein.

When electronic components are arranged in the first cavity Q1, since most electronic components have irregular shapes and all electronic components have different heights when there are a plurality of electronic components, there may also be gaps between adjacent electronic components, so that when the gas in the first cavity Q1 forms an airflow, the airflow is divided by outer surfaces of the electronic components. That is, the airflow in the first cavity Q1 may be divided into a plurality of streams in a space defined by the outer surfaces of the electronic components and the inner wall of the first cavity Q1, so that a flow line of the airflow in the first cavity Q1 becomes more complex, which easily causes the airflow divided into the plurality of streams to intersect with each other, resulting in greater flow resistance.

In this way, the heat exchange member 120 includes a plurality of heat exchange bodies 121, so that the heat exchange channel P is formed by a plurality of heat exchange sub-channels p1 and the gas in the first cavity Q1 can enter different heat exchange sub-channels p1 respectively when entering the heat exchange member 120. All the heat exchange sub-channels p1 may rectify an incoming relatively disordered airflow, so that the airflow has a more orderly state, thereby reducing flow resistance, facilitating the airflow to circulate between the first cavity Q1 and the heat exchange channel P under the action of the first airflow generator 130, further facilitating heat dissipation of electronic components, and further improving a heat dissipation effect.

Figures 11, 12:
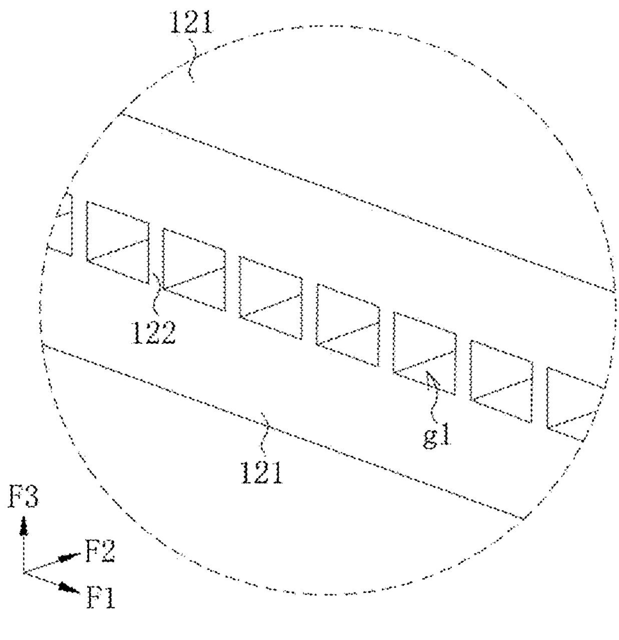
FIG. 11 is a partial enlarged structure at G in FIG. 5.
FIG. 12 is a front view showing cooperation between the heat exchange member, the first communication member, and the second communication member according to another embodiment of the present disclosure.

FIG. 11 is a partial enlarged structure at G in FIG. 5. For ease of description, only content related to the embodiments of the present disclosure is illustrated.

In some embodiments, still referring to FIG. 5 and FIG. 7 to FIG. 10 together with FIG. 11, along the direction in which the first cavity Q1 points to the second cavity Q2, there is a first interval g1 between two adjacent heat exchange bodies 121. A size of the first interval g1 may be configured according to a specific usage condition, which is not specifically limited herein.

Since the first interval g1 exists between two adjacent heat exchange bodies 121, side surfaces of the two adjacent heat exchange bodies 121 facing each other are exposed in the second cavity Q2 and participate in a heat dissipation process. In this way, by exposing the side surfaces of the two adjacent heat exchange bodies 121 facing each other, a heat dissipation area can be increased, which helps to improve the heat exchange effect of the gas in the first cavity Q1 and the gas in the second cavity Q2.

In some embodiments, still referring to FIG. 5, FIG. 7, and FIG. 8, the heat exchange member 120 further includes a plurality of partitions 122. Along an extension direction of the heat exchange channel P, the plurality of partitions 122 are sequentially spaced apart in the first interval g1.

The partition 122 is a component configured to divide the first interval g1 into a plurality of intervals. The partition 122 may be configured as a plate-like structure as shown in FIG. 5, FIG. 7, and FIG. 8. Certainly, the partition 122 may alternatively be configured in other shapes, which is not specifically limited herein. It is to be noted that extension directions of the heat exchange sub-channels p1 of the heat exchange bodies 121 are substantially the same, and an extension direction of the heat exchange channel P may also be regarded as the extension directions of the heat exchange sub-channels p1.

In this way, through the arrangement of the plurality of partitions 122 in the first interval g1, the heat dissipation area of the heat exchange member 120 can be further increased within a limited space, thereby further improving the heat dissipation effect.

In some embodiments, still referring to FIG. 5, FIG. 7, and FIG. 8, along the direction in which the first cavity Q1 points to the second cavity Q2, the partition 122 is connected to two corresponding heat exchange bodies 121.

In this way, one end of the partition 122 is connected to one of the two corresponding heat exchange bodies 121, and the other end of the partition 122 is connected to the other one of the two corresponding heat exchange bodies 121, which is easy to manufacture and can also further increase the heat dissipation area. It should be understood that, in this case, heat exchange effects of two adjacent heat exchange bodies 121 can be improved by using the partition 122, thereby further improving utilization of space when the space is limited.

In some other embodiments, one end of the partition 122 is connected to one of the two corresponding heat exchange bodies 121, and the other end of the partition 122 is suspended, which may be configured according to a specific usage condition and is not specifically limited herein.

In some embodiments, still referring to FIG. 5, FIG. 7, and FIG. 8, the partition 122 extends along a first preset direction, and the first preset direction, the direction in which the first cavity Q1 points to the second cavity Q2, and the direction in which the air inlet k1 points to the air outlet k2 are perpendicular to each other. In the embodiments of the present disclosure, the first preset direction and the second direction F2 are parallel to each other, the direction in which the air inlet k1 points to the air outlet k2 and the first direction F1 are parallel to each other, and the direction in which the first cavity Q1 points to the second cavity Q2 and the third direction F3 are parallel to each other.

In this way, the extension direction of the partition 122 is controlled, which facilitates manufacturing and also facilitates cooperation between related heat dissipation components in the second cavity Q2 to achieve a better heat dissipation effect.

In some embodiments, still referring to FIG. 2, FIG. 3, FIG. 5, FIG. 7, FIG. 9, and FIG. 10, the power conversion system 100 further includes a first communication member 140 and a second communication member 150 that are arranged in the second cavity Q2 and connected to the heat exchange bodies 121. The first communication member 140 has a first communication cavity L1, and the second communication member 150 has a second communication cavity L2. The first communication cavity L1 is in communication with the first cavity Q1 and the air inlet k1, and the second communication cavity L2 are in communication with the first cavity Q1 and the air outlet k2.

Taking FIG. 7 to FIG. 9 as an example, one end of the heat exchange member 120 along the first direction F1 is connected to the first communication member 140, and the other end of the heat exchange member 120 along the first direction F1 is connected to the second communication member 150. Referring to FIG. 2 and FIG. 6, the first communication member 140 covers the first opening u1 of the partition wall 112, and the second communication member 150 covers the second opening u2 of the partition wall 112. The first communication cavity L1 is in communication with the first cavity Q1 via the first opening u1, and the second communication cavity L2 is in communication with the first cavity Q1 via the second opening u2. A size of the first communication cavity L1 and a size of the second communication cavity L2 may be set according to a specific usage condition, which is not specifically limited herein.

In this way, through the arrangement of the first communication member 140 and the second communication member 150, it is easy to arrange the heat exchange member 120, so that the heat exchange channel P is in communication with the first cavity Q1 and a certain flow space can be provided for the airflow by using the first communication cavity L1 and the second communication cavity L2 to buffer the airflow, thereby facilitating the airflow to flow into and out of the heat exchange channel P and facilitating the airflow to flow between the first cavity Q1 and the heat exchange channel P.

In some embodiments, still referring to FIG. 5 and FIG. 7, along the direction in which the first cavity Q1 points to the second cavity Q2, a dimension of the first communication cavity L1 is greater than a sum of dimensions of all the heat exchange sub-channels p1. In addition, along the direction in which the first cavity Q1 points to the second cavity Q2, a dimension of the second communication cavity L2 is greater than the sum of dimensions of all the heat exchange sub-channels p1.

For example, taking FIG. 7 as an example, a dimension of the first communication cavity L1 in the third direction F3 and a dimension of the second communication cavity L2 in the third direction F3 may both be greater than a dimension of the heat exchange channel P in the third direction F3. The dimension of the heat exchange channel P in the third direction F3 is a sum of dimensions of all the heat exchange sub-channels p1 in the third direction F3.

In this way, the first communication cavity L1 and the second communication cavity L2 can further buffer the airflow and cooperate with the heat exchange sub-channels p1, which facilitates rectification of the airflow by the heat exchange sub-channels p1.

In addition, by controlling the dimension and the position of the heat exchange member 120 in the third direction F3, the flowing of the airflow can be realized in cooperation with the first communication member 140 and the second communication member 150, and the components in the second cavity Q2 can also be avoided, which helps to obtain a more compact space and achieve more effective use of space. That is, a flow state of the airflow can be adjusted by controlling sizes of the first communication cavity L1 and the second communication cavity L2.

In some embodiments, still referring to FIG. 7, FIG. 9, and FIG. 10, along the direction in which the air inlet k1 points to the air outlet k2, the first communication cavity L1 has a first inner wall b1 arranged towards the second communication cavity L2, and the second communication cavity L2 has a second inner wall b2 arranged towards the first communication cavity L1. The inlets of all the heat exchange sub-channels p1 are provided in the first inner wall b1, and the outlets of all the heat exchange sub-channels p1 are provided in the second inner wall b2. That is, the sub-air inlets k11 of all the heat exchange sub-channels p1 are provided in the first inner wall b1, and the sub-air outlets k21 of all the heat exchange sub-channels p1 are provided in the second inner wall b2.

In this way, the inlets of all the heat exchange sub-channels p1 are provided in the same inner wall of the first communication cavity L1, and the outlets of all the heat exchange sub-channels p1 are provided in the same inner wall of the second communication cavity L2, which helps to save space. At the same time, since the first inner wall b1 and the second inner wall b2 are respectively located on sides of the first communication cavity L1 and the second communication cavity L2 facing each other, it is conducive to shortening a length of the sub-heat exchange channel p1, thereby helping to reduce resistance of the airflow and facilitating the airflow to flow between the first cavity Q1 and the heat exchange channel P and improving the heat exchange effect.

In some embodiments, still referring to FIG. 5 and FIG. 7, the first communication cavity L1 has a first communication port t1 in communication with the first cavity Q1, and a dimension of the first communication port t1 along a second preset direction is equal to a dimension of the inlet of the sub-heat exchange channel p1 along the second preset direction. The second preset direction, the direction in which the first cavity Q1 points to the second cavity Q2, and the direction in which the air inlet k1 points to the air outlet k2 are perpendicular to each other. In the embodiments of the present disclosure, the second preset direction and the second direction F2 are parallel to each other, the direction in which the first cavity Q1 points to the second cavity Q2 and the third direction F3 are parallel to each other, and the direction in which the air inlet k1 points to the air outlet k2 and the first direction F1 are parallel to each other. The dimension of the first communication port t1 along the second preset direction is a first dimension h1 illustrated in FIG. 5.

In this way, the dimension of the first communication cavity L1 and the dimension of the sub-heat exchange channel p1 in the second preset direction are equal, which facilitates the gas to sequentially flow in the first communication cavity L1 and the sub-heat exchange channel p1 more smoothly and also helps to reduce fluid resistance in the second preset direction, thereby facilitating the gas to flow between the first cavity Q1 and the heat exchange channel P.

In some embodiments, still referring to FIG. 5 and FIG. 7, the second communication cavity L2 has a second communication port t1 in communication with the first cavity Q1, and a dimension of the second communication port t1 along a third preset direction is equal to a dimension of the inlet of the sub-heat exchange channel p1 along the third preset direction. The third preset direction, the direction in which the first cavity Q1 points to the second cavity Q2, and the direction in which the air inlet k1 points to the air outlet k2 are perpendicular to each other. In the embodiments of the present disclosure, the third preset direction and the second direction F2 are parallel to each other, the direction in which the first cavity Q1 points to the second cavity Q2 and the third direction F3 are parallel to each other, and the direction in which the air inlet k1 points to the air outlet k2 and the first direction F1 are parallel to each other. The dimension of the second communication port t1 along the third preset direction is a second dimension h2 illustrated in FIG. 5.

In this way, the dimension of the second communication cavity L2 and the dimension of the sub-heat exchange channel p1 in the third preset direction are equal, which facilitates the gas to sequentially flow in the sub-heat exchange channel p1 and the second communication cavity L2 more smoothly and also helps reduce fluid resistance in the third preset direction, thereby facilitating the gas to flow between the first cavity Q1 and the heat exchange channel P.

It should be understood that since the second preset direction and the third preset direction are parallel to each other and the first dimension h1 and the second dimension h2 are equal, the dimension of the sub-heat exchange channel p1 along the second preset direction (the third preset direction) is equal to the first dimension h1 (the second dimension h2), which can further improve the stability of gas flow and reduce the fluid resistance.

In some embodiments, still referring to FIG. 5 and FIG. 7, a volume of the first communication cavity L1 is equal to that of the second communication cavity L2.

Certainly, in some other embodiments, the volume of the first communication cavity L1 may be greater than that of the second communication cavity L2, or the volume of the first communication cavity L1 may be less than that of the second communication cavity L2, which is not specifically limited herein. It should be understood that when the volume of the first communication cavity L1 is equal to that of the second communication cavity L2, it is conducive to reducing the fluid resistance, further conducive to flowing of the airflow, and also conducive to manufacturing of the first communication member 140 and the second communication member 150.

In some embodiments, still referring to FIG. 5 and FIG. 7, the first inner wall b1 and the second inner wall b2 are both arranged perpendicularly to the direction in which the air inlet k1 points to the air outlet k2. In the embodiments of the present disclosure, the first inner wall b1 and the second inner wall b2 are both arranged perpendicularly to the first direction F1.

In this way, it is conducive for the airflow to flow along the direction in which the air inlet k1 points to the air outlet k2, and it is also conducive to manufacturing of the first communication member 140 and the second communication member 150.

It is to be noted that the first communication member 140, the heat exchange member 120, and the second communication member 150 may be of an integrated structure or a separated structure, which is not specifically limited herein. In the embodiments of the present disclosure, the first communication member 140, the heat exchange member 120, and the second communication member 150 is of an integrated structure.

In addition, a position of the heat exchange member 120 in the first direction F3 may be determined according to arrangement of the components in the second cavity Q2. Specifically, referring to FIG. 3 and FIG. 5, a top surface of the first communication member 140 and a top surface of the second communication member 150 are approximately located on a first plane, a bottom surface of the first communication member 140 and a bottom surface of the second communication member 150 are approximately located on a second plane, and the first plane and the second plane define a mounting space for arranging the heat exchange member 120. In the mounting space, the heat exchange member 120 may be arranged near the top, near the bottom, or in the middle. In the embodiments of the present disclosure, the heat exchange member 120 is arranged in the middle of the mounting space. Specifically, one end of the heat exchange member 120 is connected to the middle of the first communication member 140 along the third direction F3, and the other end of the heat exchange member 120 is connected to the middle of the second communication member 150 along the third direction F3, which may be configured according to a specific usage condition and is not specifically limited herein.

FIG. 12 is a front view showing cooperation between the heat exchange member 120, the first communication member 140, and the second communication member 150 according to another embodiment of the present disclosure. For ease of description, only content related to the embodiments of the present disclosure is illustrated.

In some embodiments, still referring to FIG. 2, FIG. 3, FIG. 5, and FIG. 7 and together with FIG. 12, the tank 110 includes a partition wall 112, and the first cavity Q1 and the second cavity Q2 are separated by the partition wall 112. The heat exchange body 121 in all the heat exchange bodies 121 that is closest to the first cavity Q1 is a first target body M1, and a second interval g2 is formed between the first target body M1 and the partition wall 112. That is, in the embodiments of the present disclosure, in the third direction F3, the heat exchange body 121 at the top is the first target body M1, and there is a second gap between the heat exchange body 121 at the top and the partition wall 112.

In this way, the second gap is defined between the heat exchange member 120 and the partition wall 112, and the heat dissipation area of the heat exchange member 120 is further increased by using the second gap, which helps to further improve the heat exchange effect of the heat exchange member 120.

In some embodiments, still referring to FIG. 12, the heat exchange member 120 further includes a plurality of first heat exchange fins 123. Along an extension direction of the heat exchange channel P, all the first heat exchange fins 123 are sequentially spaced apart in the second interval g2.

In this way, through the arrangement of the plurality of first heat exchange fins 123, the heat dissipation effect of the heat exchange member 120 is further improved, and the heat exchange effect of the heat exchange member 120 is further improved In some embodiments, still referring to FIG. 12, the heat exchange member 120 further includes a plurality of second heat exchange fins 124. The heat exchange body 121 in all the heat exchange bodies 121 that is farthest from the first cavity Q1 is a second target body M2. Along an extension direction of the heat exchange channel P, all the second heat exchange fins 124 are sequentially spaced apart on a side of the second target body M2 away from the first cavity Q1. That is, in the embodiments of the present disclosure, in the third direction F3, the heat exchange body 121 at the bottom is the second target body M2.

In this way, through the arrangement of the plurality of second heat exchange fins 124, the heat dissipation effect of the heat exchange member 120 is further improved, and the heat exchange effect of the heat exchange member 120 is further improved.

Certainly, in some other embodiments, the heat exchange fins 123 may alternatively be arranged on a top side and a bottom side of the heat exchange member 120, respectively. The heat exchange member 120 has one channel, and the channel is the heat exchange channel P.

It should be understood that since the heat exchange member 120 includes the plurality of heat exchange bodies 121 and the partition wall 112, it is conducive for the airflow to flow, and it is also conducive to improving the heat dissipation effect of the heat exchange member 120 when space is limited. Further, since the heat exchange member 120 further includes first heat exchange fins 123 and second heat exchange fins 124, the heat dissipation effect of the heat exchange member 120 can be further improved, which may be set according to a specific usage condition and is not specifically limited herein.

In some embodiments, still referring to FIG. 5 and FIG. 7, the heat exchange sub-channels p1 extend linearly along the direction in which the air inlet k1 points to the air outlet k2, and the direction in which the air inlet k1 points to the air outlet k2 is perpendicular to the direction in which the first cavity Q1 points to the second cavity Q2. That is, in the embodiments of the present disclosure, the heat exchange sub-channels p1 extend linearly along the first direction F1. In this way, the length of the sub-heat exchange channel p1 can be further reduced, thereby further reducing resistance to flowing of the airflow.

In some embodiments, still referring to FIG. 5, FIG. 7, and FIG. 8, along the direction in which the air inlet k1 points to the air outlet k2, cross-sectional areas of all the heat exchange sub-channels p1 are equal. Since the cross-sectional areas of all the heat exchange sub-channels p1 are equal, resistance of the airflow in the heat exchange sub-channels p1 is substantially the same. In this way, through mutual cooperation of all the heat exchange sub-channels p1, it is conducive to improving stability of the airflow and further reducing resistance to flowing of the airflow.

In some embodiments, still referring to FIG. 7 and FIG. 8, along the direction in which the air inlet k1 points to the air outlet k2, the cross-sectional areas of all the heat exchange sub-channels p1 are unchanged. In this way, it is conducive to reducing resistance to flowing of the gas and further facilitating the flowing of the gas.

In some embodiments, still referring to FIG. 5, FIG. 7, and FIG. 8, two heat exchange sub-channels p1 are provided. That is, two heat exchange bodies 121 are provided. In this way, the number of the heat exchange channel P may be configured in combination with used space while a certain heat exchange effect is achieved.

In some embodiments, still referring to FIG. 2 to FIG. 4 and FIG. 6, the first airflow generator 130 includes a first airflow generating member 131 and a second airflow generating member 132. The first airflow generating member 131 is arranged in the first cavity Q1 or the second cavity Q2, and the second airflow generating member 132 is arranged in the first cavity Q1 or the second cavity Q2. The first airflow generating member 131 and the second airflow generating member 132 are sequentially located on a target path, and the target path is a fluid path where the airflow flows through the air outlet k2 and sequentially enters between the first cavity Q1 and the air inlet k1.

In this way, through mutual cooperation of the first airflow generating member 131 and the second airflow generating member 132, the airflow can circulate between the first cavity Q1 and the heat exchange channel P, thereby continuously enabling the gas in the first cavity Q1 and the gas in the second cavity Q2 to perform heat exchange.

In some embodiments, still referring to FIG. 2 to FIG. 4 and FIG. 6, the first airflow generating member 131 and the second airflow generating member 132 are both arranged in the first cavity Q1. In this way, through the arrangement of the first airflow generating member 131 and the second airflow generating member 132 in the first cavity Q1, it is more conducive to inputting the gas in the first cavity Q1 into the heat exchange channel P and outputting the gas from the heat exchange channel P.

In some embodiments, still referring to FIG. 2, FIG. 4, and FIG. 6, the first cavity Q1 has two first side walls C1 oppositely arranged along the first direction F1, and two second side walls C2 oppositely arranged along the second direction F2. Each of the first side walls C1 is connected to the two second side walls C2, and each of the first side walls C1 and the two second side walls C2 define two corner portions CP. The first airflow generating member 131 is arranged in a first target corner portion, and the second airflow generating member 132 is arranged in a second target corner portion. The first target corner portion and the second target corner portion are two corner portions CP in all the corner portions CP that are not adjacent along a circumferential direction of the first cavity Q1. The circumferential direction of the first cavity Q1 is an arrangement direction of the two first side walls C1 and the two second side walls C2, and the first direction F1, the second direction F2, and the direction in which the first cavity Q1 points to the second cavity Q2 are perpendicular to each other.

Specifically, the two first side walls C1 and the two second side walls C2 define four corner portions CP, which are a first corner portion CP1, a second corner portion CP2, a third corner portion CP3, and a fourth corner portion CP4, respectively. The first corner portion CP1 and the third corner portion CP3 may be the first target corner portion and the second target corner portion, respectively, or the second corner portion CP2 and the fourth corner portion CP4 may be the first target corner portion and the second target corner portion, respectively. In the embodiments of the present disclosure, the first frame body 111*a* defines the four corner portions CP, the direction in which the first cavity Q1 points to the second cavity Q2 is parallel to the third direction F3, the first corner portion CP1 is the first target corner portion, and the third corner portion CP3 is the second target corner portion. That is, the first airflow generating member 131 is arranged in the first corner portion CP1, and the second airflow generating member 132 is arranged in the second corner portion CP3.

In this way, since the first airflow generating member 131 and the second airflow generating member 132 are located in two corner portions CP that are not adjacent, a distance between the first airflow generating member 131 and the second airflow generating member 132 may be longer, so that an annular airflow can be formed along the circumferential direction of the first cavity Q1 by using positions of the first airflow generating member 131 and the second airflow generating member 132. In this way, the gas in the first cavity Q1 can be driven by the formed annular airflow into the heat exchange channel P as much as possible for heat exchange, so as to further improve the heat dissipation effect of the components located in the first cavity Q1.

In some embodiments, still referring to FIG. 4 and FIG. 6, the air outlet k2 is arranged adjacent to the second target corner portion, and the air inlet k1 is arranged adjacent to the third target corner portion. The third target corner portion is one of the remaining corner portions CP in the four corner portions CP except the first target corner portion and the second target corner portion. In the embodiments of the present disclosure, the second corner portion CP2 is the third target corner portion. Specifically, the first opening u1 is arranged adjacent to the third target corner portion, and the second opening u2 is arranged adjacent to the second target corner portion.

In this way, along an annular path of the airflow, the first opening u1 is generally located between the first airflow generating member 131 and the second airflow generating member 132, and the second opening u2 is generally arranged corresponding to the second airflow generating member 132. Since the air inlet k1 of the heat exchange member 120 corresponds to the first opening u1 and the air outlet k2 of the heat exchange member 120 corresponds to the second opening u2, under the action of the formed annular airflow, the airflow can flow into the air inlet k1 of the heat exchange member 120, and under the action of the second airflow generating member 132, flow back to the first cavity Q1 from the air outlet k2. In this process, it is conducive for the gas to flow and also conducive to controlling the gas to circulate through the first airflow generating member 131 and the second airflow generating member 132, thereby improving the heat dissipation effect of the components in the first cavity Q1.

In some embodiments, still referring to FIG. 4 and FIG. 6, an outlet side of the first airflow generating member 131 is arranged towards the third target corner portion, and an outlet side of the second airflow generating member 132 is arranged towards the fourth target corner portion. The fourth target corner portion is one of the four corner portions CP except the first target corner portion, the second target corner portion, and the third target corner portion. In the embodiments of the present disclosure, the fourth corner portion CP4 is the fourth target corner portion.

Since the outlet side of the first airflow generating member 131 faces the first opening u1 and an inlet side of the second airflow generating member 132 faces the second opening u2, it is beneficial for the airflow to enter the air inlet k1 of the heat exchange member 120 through the first opening u1 and flow back to the first cavity Q1 from the air outlet k2 of the heat exchange member 120 through the second opening u2.

In some embodiments, still referring to FIG. 4 and FIG. 6, an outlet direction of the first airflow generating member 131, an outlet direction of the second airflow generating member 132, and a target direction are parallel to each other, and the outlet direction of the first airflow generating member 131 and the outlet direction of the second airflow generating member 132 are opposite to each other. The target direction is parallel to the first direction F1 or the second direction F2. In the embodiments of the present disclosure, the target direction is parallel to the second direction F2. That is, an airflow output direction of the first airflow generating member 131 is opposite to that of the second airflow generating member 132.

In this way, the airflow output direction of the first airflow generating member 131 and the airflow output direction of the second airflow generating member 132 are opposite directions, which helps to form an annular airflow in cooperation with the inner wall of the first cavity Q1.

In some embodiments, still referring to FIG. 2, FIG. 3, FIG. 4, and FIG. 6, the power conversion system 100 further includes a flow guiding member 160 arranged in the first cavity Q1. The flow guiding member 160 has a flow guiding inlet d1 and a flow guiding outlet d2 in communication with each other. The flow guiding inlet d1 is in communication with the air outlet k2, and the flow guiding outlet d2 is in communication with an inlet of the second airflow generating member 132. Specifically, the flow guiding member 160 has a flow guiding cavity D, and the flow guiding cavity D has a flow guiding inlet d1 and a flow guiding outlet d2. In the perspective of FIG. 6, positions of the flow guiding inlet d1, the flow guiding outlet d2, and the flow guiding cavity D are shown by dashed boxes and dashed arrows.

In this way, through the arrangement of the flow guiding member 160, it is easy for the gas flowing out of the air outlet k2 to flow into the second airflow generating member

132, and then the gas can be better extracted from the heat exchange channel P via the second airflow generating member 132, which further facilitates the flowing of the gas.

In some embodiments, still referring to FIG. 2, FIG. 3, FIG. 4, and FIG. 6, an end of the flow guiding member 160 provided with the flow guiding outlet d2 is connected to an air inlet side of the second airflow generating member 132. Specifically, one end of the flow guiding member 160 may cover the second opening u2 of the partition wall 112, and the other end of the flow guiding member 160 is connected to the second airflow generating member 132.

In this way, through the flow guiding cavity D of the flow guiding member 160, the airflow can be gathered to form certain wind pressure, which further facilitates the second airflow generating member 132 to extract the gas from the heat exchange channel P.

In some embodiments, still referring to FIG. 4 and FIG. 6, the power conversion system 100 further includes a partition wall 112 arranged in the tank 110, and the first cavity Q1 and the second cavity Q2 are separated via the partition wall 112. The partition wall 112 includes a first region z1 and a second region z2 arranged around the first region z1. The power conversion system 100 further includes a plurality of electronic components arranged in the first cavity Q1, and all the electronic components are arranged in the first region z1. In this way, it is conducive to forming an annular airflow in the first region z1 to drive the flowing of the gas in the second region z2, thereby improving heat dissipation effects of the electronic components.

In some embodiments, still referring to FIG. 4 and FIG. 6, the power conversion system 100 further includes a printed circuit board (PCB) 170, and all the electronic components are arranged on the PCB 170. The PCB 170 and all the electronic components thereon form a printed circuit board assembly (PCBA). The PCB 170 may be placed on the partition wall 112 and located in the first cavity Q1. Specifically, the first airflow generating member 131 and the second airflow generating member 132 may be arranged on the PCB 170. In this way, the structure of the partition wall 112 may be flexibly configured according to a usage requirement, which is not specifically limited herein.

In some embodiments, still referring to FIG. 3, FIG. 4, and FIG. 6, the first airflow generating member 131 is a fan; and/or the second airflow generating member 132 is a fan. In this way, the first airflow generator 130 is easier to manufacture and can also generate an airflow through rotation of fan blades.

Figure 13:
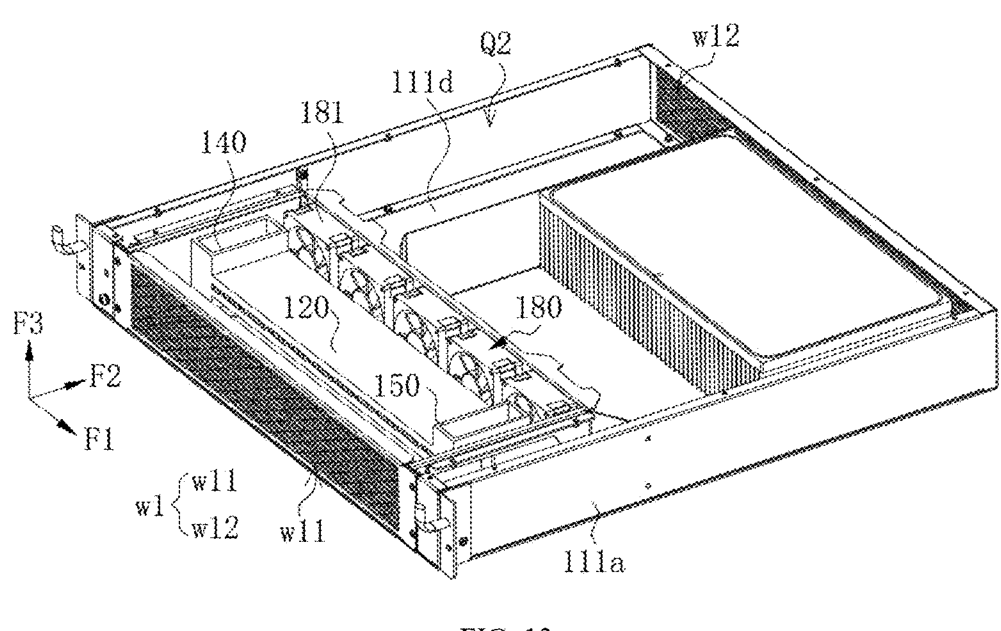
FIG. 13 is a schematic diagram III of a three-dimensional structure of the power conversion system shown in FIG. 1 with a partial structure removed.
Figure 14:
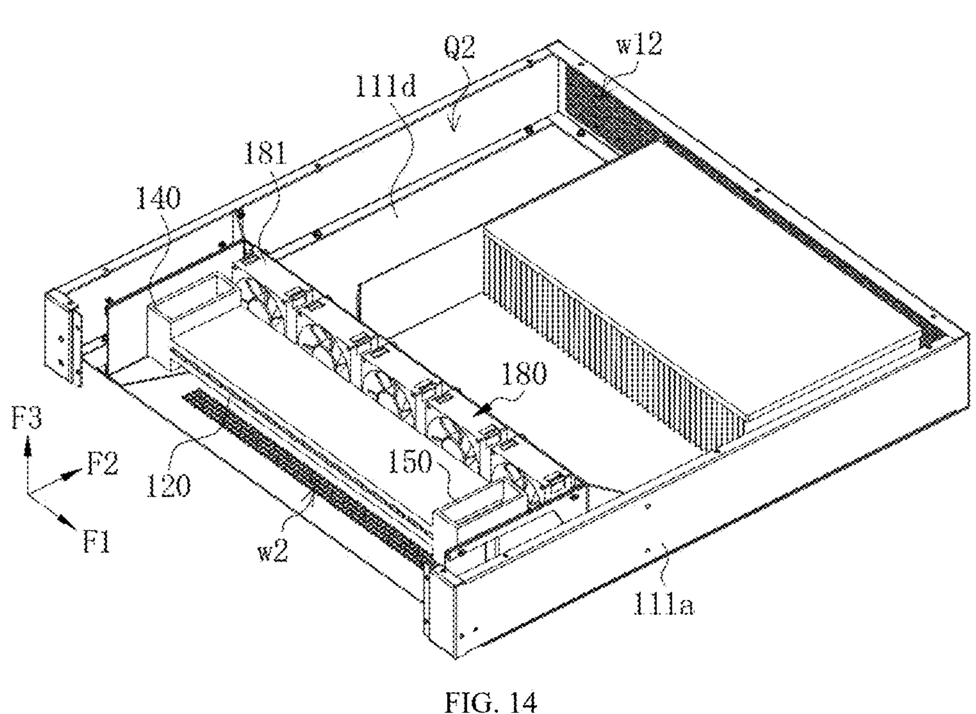
FIG. 14 is a schematic diagram of a three-dimensional structure of the structure shown in FIG. 13 with a partial structure removed.

FIG. 13 is another perspective view of the power conversion system 100 shown in FIG. 1 with a partial structure removed; and FIG. 14 is a perspective view of FIG. 13 with a partial structure removed. For ease of description, only content related to the embodiments of the present disclosure is illustrated.

In some embodiments, still referring to FIG. 2 and FIG. 3 together with FIG. 13 and FIG. 14, the tank 110 is provided with a first vent w1 communicating the second cavity Q2 with the outside of the tank 110. The power conversion system 100 further includes a second airflow generator 180 arranged in the second cavity Q2. The second airflow generator 180 is configured to input gas located outside the tank 110 into the second cavity Q2 via the first vent w1 and output gas located in the second cavity Q2 to the outside of the tank 110. Specifically, the first vent w1 may be provided in a side wall of the second frame body 111*b*. The second airflow generator 180 may be understood with reference to the first airflow generator 130. Detail are not described herein again. In this way, through the arrangement of the second airflow generator 180 in the second cavity Q2, heat dissipation of the components in the second cavity Q2 is achieved by gas flow, which helps to improve safety performance.

In some embodiments, still referring to FIG. 13 and FIG. 14, the first vent w1 includes a first through hole w11 located on the air inlet side of the second airflow generator 180 and a second through hole w12 located on an air outlet side of the second airflow generator 180. Along a direction in which the first through hole w11 points to the second through hole w12, the heat exchange member 120 is located between the first through hole w11 and the second airflow generator 180. In the embodiments of the present disclosure, the first through hole w11 and the second through hole w12 are oppositely arranged along the second direction F2, and a plurality of first through holes w11 and a plurality of second through holes w12 are provided. That is, the plurality of first through holes w11 may all be provided in one side wall of the second frame body 111*b* along the second direction F2, and the plurality of second through holes w12 may all be provided in the other side wall of the second frame body 111*b* along the second direction F2.

In this way, since the first through hole w11 and the second through hole w12 are oppositely arranged, when the second airflow generator 180 generates an airflow, an external airflow flows into the second cavity Q2 from the first through hole w11 and flows out of the second cavity Q2 from the second through hole w12. Since the heat exchange member 120 is located between the first through hole w11 and the second airflow generator 180, the heat exchange member 120 can dissipate heat via the flowing of the gas in the second cavity Q2, thereby improving the heat dissipation effect of the heat exchange member 120.

In some embodiments, still referring to FIG. 13 and FIG. 14, the second airflow generator 180 includes a plurality of third airflow generating members 181 sequentially arranged along a fourth preset direction. Air inlet sides of all the third airflow generating members 181 are located on the same side, and air outlet sides of all the third airflow generating members 181 are located on the same side. A direction in which the air inlet sides of the third airflow generating members 181 point to the air outlet sides of the third airflow generating members 181 is perpendicular to the fourth preset direction. In the embodiments of the present disclosure, the fourth preset direction and the first direction F1 are parallel to each other, and the direction in which the air inlet sides of the third airflow generating members 181 point to the air outlet sides of the third airflow generating members 181 and the second direction F2 are parallel to each other.

In this way, by controlling the arrangement of the third airflow generating members 181, it is conducive to improving heat dissipation effects of the components in the second cavity Q2 and also conducive to arranging the components in the second cavity Q2. It should be understood that since main electronic components are arranged in the first cavity Q1 and main heat dissipation components are also located in the first cavity Q1, compared with the first cavity Q1, the second cavity Q2 has enough space to accommodate components such as the heat exchange member 120 and the second airflow generator 180, and it is easier to improve the heat dissipation effect by arranging and using the components in the second cavity Q2.

In some embodiments, still referring to FIG. 13 and FIG. 14, the second airflow generator 180 includes at least one fan. In this way, the second airflow generator 180 is easier to manufacture and can also generate an airflow through rotation of fan blades.

In some embodiments, still referring to FIG. 2 and FIG. 14, the tank 110 is provided with a second vent w2 communicating the second cavity Q2 with the outside of the tank 110. An orthographic projection of the second vent w2 on a reference plane at least partially overlaps with an orthographic projection of the heat exchange member 120 on the reference plane. The reference plane is a plane perpendicular to the direction in which the first cavity Q1 points to the second cavity Q2.

In the embodiments of the present disclosure, the bottom plate 111*d* is provided with a plurality of second vents w2. In this way, through the arrangement of the second vent w2, the heat dissipation effect of the heat exchange member 120 is further improved, thereby further improving the heat exchange effect of the heat exchange member 120.

In some embodiments, still referring to FIG. 2 and FIG. 3, the second cavity Q2 is located on a bottom side of the first cavity Q1, and the direction in which the first cavity Q1 points to the second cavity Q2 is a direction of gravity. That is, the third direction F3 and the direction of gravity are parallel to each other. In this way, it is conducive to improving the heat dissipation effect of the components in the first cavity Q1 and also conducive to arrangement of other components in the system using the power conversion system 100.

In some embodiments, still referring to FIG. 1, the power conversion system 100 may have at least one of a photovoltaic interface, a battery interface, a grid input interface, a DC output interface, and an AC output interface.

Solar panels or other renewable energy generation systems and the power conversion system 100 can be connected through the photovoltaic interface. A battery and the power conversion system 100 are connected through the battery interface. The battery may store electrical energy, so that the electrical energy of the battery can be converted and outputted through the power conversion system 100. The grid input interface may be connected to high-voltage power from a power grid, which is then outputted to a low-voltage power device or system after voltage reduction by the power conversion system 100. The AC output interface may be connected to a product that requires an AC such as a household appliance. The power conversion system 100 converts the AC to a DC and outputs the DC to the appliance. The DC output interface may be connected to a device that requires DC power such as a charging pile.

In this way, flexible setting can be made according to actual usage requirements, thereby improving adaptability of the power conversion system 100 and meet usage requirements in different scenarios, which is not specifically limited herein.

Based on the same inventive concept, embodiments of the present disclosure provide an energy storage system, including the power conversion system 100 in any one of the above embodiments.

In some embodiments, the energy storage system further includes a battery, and the power conversion system 100 is electrically connected to the battery. The power conversion system 100 may convert energy generated by solar power, wind power, or fuel cells into a DC, store the DC in the battery, and output the electrical energy in the battery when needed. The energy storage system can provide a user with reliable energy reserves, and provide the user with backup power in case of power failure or power shortage, which is convenient for the user to use.

The energy storage system also has the advantages of the above power conversion system 100. Details are not described herein.

The technical features of the above-mentioned embodiments can be combined arbitrarily. In order to make the description concise, not all possible combinations of the technical features are described in the embodiments. However, as long as there is no contradiction in the combination of these technical features, the combinations should be considered as in the scope of the specification.

The above-described embodiments are only several implementations of the present disclosure, and the descriptions are relatively specific and detailed, but they should not be construed as limiting the scope of the present disclosure. It should be understood by those of ordinary skill in the art that various modifications and improvements can be made without departing from the concept of the present disclosure, and all fall within the protection scope of the present disclosure. Therefore, the patent protection of the present disclosure shall be defined by the appended claims.

What is claimed is:

1. A power conversion system, comprising:

a tank provided with a first cavity and a second cavity that are separated from each other;

a heat exchange member arranged in the second cavity, the heat exchange member having a heat exchange channel, the heat exchange channel having an air inlet and an air outlet in communication with each other, and both the air inlet and the air outlet being in communication with the first cavity; and a first airflow generator arranged in the first cavity and/or the second cavity; the first airflow generator being configured to input gas located in the first cavity into the heat exchange channel via the air inlet, and output gas located in the heat exchange channel into the first cavity via the air outlet;

wherein the heat exchange member comprises a plurality of heat exchange bodies, the heat exchange bodies are provided with heat exchange sub-channels, all the heat exchange sub-channels form the heat exchange channel, inlets of all the heat exchange sub-channels define the air inlet, and outlets of all the heat exchange sub-channels define the air outlet; and all the heat exchange bodies are sequentially arranged along a direction in which the first cavity points to the second cavity.

2. The power conversion system according to claim 1, wherein along the direction in which the first cavity points to the second cavity, a first interval is formed between two adjacent heat exchange bodies, the heat exchange member further comprises a plurality of partitions; and along an extension direction of the heat exchange channel, the plurality of partitions are sequentially spaced apart in the first interval.

3. The power conversion system according to claim 1, further comprising a first communication member and a second communication member that are arranged in the second cavity and connected to the heat exchange bodies, wherein the first communication member has a first communication cavity, the second communication member has a second communication cavity, the first communication cavity is in communication with the first cavity and the air inlet, and the second communication cavity is in communication with the first cavity and the air outlet.

4. The power conversion system according to claim 3, wherein along a direction in which the air inlet points to the air outlet, the first communication cavity has a first inner wall arranged towards the second communication cavity, and the second communication cavity has a second inner wall arranged towards the first communication cavity, the inlets of all the heat exchange sub-channels are provided in the first inner wall, and the outlets of all the heat exchange sub-channels are provided in the second inner wall.

5. The power conversion system according to claim 3, wherein the first communication cavity has a first communication port in communication with the first cavity, a dimension of the first communication port along a second preset direction is equal to a dimension of the inlet of each of the heat exchange sub-channels along the second preset direction; the second preset direction, the direction in which the first cavity points to the second cavity, and a direction in which the air inlet points to the air outlet are perpendicular to each other.

6. The power conversion system according to claim 3, wherein the second communication cavity has a second communication port in communication with the first cavity, a dimension of the second communication port along a third preset direction is equal to a dimension of the inlet of each of the heat exchange sub-channels along the third preset direction, the third preset direction, the direction in which the first cavity points to the second cavity, and a direction in which the air inlet points to the air outlet are perpendicular to each other.

7. The power conversion system according to claim 3, wherein a volume of the first communication cavity is equal to a volume of the second communication cavity.

8. The power conversion system according to claim 3, wherein the first inner wall and the second inner wall are both arranged perpendicularly to a direction in which the air inlet points to the air outlet.

9. The power conversion system according to claim 3, wherein along the direction in which the first cavity points to the second cavity, a dimension of the first communication cavity is greater than a sum of dimensions of all the heat exchange sub-channels.

10. The power conversion system according to claim 3, wherein along the direction in which the first cavity points to the second cavity, a dimension of the second communication cavity is greater than a sum of dimensions of all the heat exchange sub-channels.

11. The power conversion system according to claim 1, wherein the tank comprises a partition wall, the first cavity and the second cavity are separated via the partition wall; a heat exchange body in all the heat exchange bodies that is closest to the first cavity is a first target body, a second interval is formed between the first target body and the partition wall; the heat exchange member further comprises a plurality of first heat exchange fins, and along an extension direction of the heat exchange channel, all the first heat exchange fins are sequentially spaced apart in the second interval.

12. The power conversion system according to claim 1, wherein the heat exchange member further comprises a plurality of second heat exchange fins, a heat exchange body in all the heat exchange bodies that is farthest from the first cavity is a second target body, and along an extension direction of the heat exchange channel, all the second heat exchange fins are sequentially spaced apart on a side of the second target body away from the first cavity.

13. The power conversion system according to claim 1, wherein the heat exchange sub-channels extend linearly along a direction in which the air inlet points to the air outlet, the direction in which the air inlet points to the air outlet is perpendicular to the direction in which the first cavity points to the second cavity; and/or along the direction in which the air inlet points to the air outlet, cross-sectional areas of all the heat exchange sub-channels are equal; and/or along the direction in which the air inlet points to the air outlet, the cross-sectional areas of the heat exchange sub-channels are unchanged; and/or two heat exchange sub-channels are provided.

14. The power conversion system according to claim 1, wherein the tank is provided with a second vent communicating the second cavity with an outside of the tank, an orthographic projection of the second vent on a reference plane at least partially overlaps with an orthographic projection of the heat exchange member on the reference plane, and the reference plane is a plane perpendicular to the direction in which the first cavity points to the second cavity; and/or the second cavity is located on a bottom side of the first cavity, and the direction in which the first cavity points to the second cavity is a direction of gravity.

15. The power conversion system according to claim 1, wherein the first airflow generator comprises a first airflow generating member and a second airflow generating member, the first airflow generating member is arranged in the first cavity or the second cavity, the second airflow generating member is arranged in the first cavity or the second cavity, the first airflow generating member and the second airflow generating member are sequentially located on a target path, and the target path is a fluid path where an airflow flows through the air outlet and sequentially enters between the first cavity and the air inlet.

16. The power conversion system according to claim 15, wherein both the first airflow generating member and the second airflow generating member are arranged in the first cavity, wherein the first cavity has two first side walls oppositely arranged along a first direction, and two second side walls oppositely arranged along a second direction, each of the first side walls is connected to the two second side walls, each of the first side walls and the two second side walls define two corner portions, the first airflow generating member is arranged in a first target corner portion, the second airflow generating member is arranged in a second target corner portion, the first target corner portion and the second target corner portion are two corner portions in all the corner portions that are not adjacent along a circumferential direction of the first cavity; the circumferential direction of the first cavity is an arrangement direction of the two first side walls and the two second side walls, and the first direction, the second direction, and the direction in which the first cavity points to the second cavity are perpendicular to each other; and/or the power conversion system further comprises a flow guiding member arranged in the first cavity; the flow guiding member has a flow guiding inlet and a flow guiding outlet that are in communication with each other, the flow guiding inlet is in communication with the air outlet, and the flow guiding outlet is in communication with an inlet of the second airflow generating member.

17. The power conversion system according to claim 1, wherein the tank is provided with a first vent communicating the second cavity with an outside of the tank, the power conversion system further comprises a second airflow generator arranged in the second cavity, and the second airflow generator is configured to input gas located outside the tank into the second cavity via the first vent and output gas located in the second cavity to the outside of the tank.

18. The power conversion system according to claim 17, wherein the first vent comprises a first through hole located on an air inlet side of the second airflow generator and a second through hole located on an air outlet side of the second airflow generator, and along a direction in which the first through hole points to the second through hole, the heat exchange member is located between the first through hole and the second airflow generator.

19. The power conversion system according to claim 17, wherein the second airflow generator comprises a plurality of third airflow generating members sequentially arranged along a fourth preset direction, air inlet sides of all the third airflow generating members are located on a same side, air outlet sides of all the third airflow generating members are located on a same side, and a direction in which the air inlet sides of all the third airflow generating members point to the air outlet sides of all the third airflow generating members is perpendicular to the fourth preset direction.

20. An energy storage system, comprising the power conversion system according to claim 1.

* * * * *